(12) United States Patent
McTeer

(10) Patent No.: US 7,679,193 B2
(45) Date of Patent: *Mar. 16, 2010

(54) USE OF AlN AS COOPER PASSIVATION LAYER AND THERMAL CONDUCTOR

(75) Inventor: Allen McTeer, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 106 days.

This patent is subject to a terminal disclaimer.

(21) Appl. No.: 11/710,924

(22) Filed: Feb. 27, 2007

(65) Prior Publication Data

US 2007/0164442 A1 Jul. 19, 2007

Related U.S. Application Data

(60) Continuation of application No. 09/982,953, filed on Oct. 22, 2001, now Pat. No. 7,205,223, which is a division of application No. 09/547,926, filed on Apr. 11, 2000, now Pat. No. 7,061,111.

(51) Int. Cl.
H01L 23/52 (2006.01)
(52) U.S. Cl. .................. 257/762; 257/751; 257/758; 257/774; 257/E23.145; 257/E23.167; 257/E23.168
(58) Field of Classification Search .................. 257/751, 257/752, 753, 758, 774, E23.145, 167, 168
See application file for complete search history.

(56) References Cited

U.S. PATENT DOCUMENTS

| 4,611,745 A | 9/1986 | Nakahashi et al. |
| 4,987,750 A | 1/1991 | Meckler |
| 5,270,263 A | 12/1993 | Kim et al. |
| 5,393,703 A | 2/1995 | Olowolafe et al. |
| 5,447,599 A | 9/1995 | Li et al. |
| 5,476,817 A | 12/1995 | Numata |
| 5,510,651 A | 4/1996 | Maniar et al. |
| 5,612,254 A | 3/1997 | Mu et al. |
| 5,650,361 A | 7/1997 | Radhakrishnan |
| 5,665,633 A | 9/1997 | Meyer |
| 5,670,387 A | 9/1997 | Sun |
| 5,739,579 A * | 4/1998 | Chiang et al. ............... 257/635 |
| 5,783,483 A | 7/1998 | Gardner |
| 5,847,463 A | 12/1998 | Trivedi et al. |
| 5,874,777 A | 2/1999 | Ohmi et al. |
| 5,928,769 A | 7/1999 | Monma et al. |
| 5,939,788 A * | 8/1999 | McTeer ....................... 257/751 |
| 6,016,000 A * | 1/2000 | Moslehi ....................... 257/522 |
| 6,139,696 A | 10/2000 | Arunachalam et al. |
| 6,143,641 A * | 11/2000 | Kitch .......................... 438/618 |
| 6,181,012 B1 | 1/2001 | Edelstein et al. |
| 6,249,056 B1 | 6/2001 | Kwon et al. |

(Continued)

FOREIGN PATENT DOCUMENTS

EP 0 260 906 A2 9/1987
EP 0 692 824 A2 7/1995

Primary Examiner—Charles D Garber
Assistant Examiner—Yasser A Abdelaziez
(74) Attorney, Agent, or Firm—Dickstein Shapiro LLP

(57) ABSTRACT

A copper interconnect structure is disclosed as comprising a copper layer and an aluminum nitride layer formed over the copper layer. The aluminum nitride layer passivates the copper layer surface and enhances the thermal conductivity of a semiconductor substrate by radiating heat from the substrate as well as from the copper layer.

11 Claims, 7 Drawing Sheets

U.S. PATENT DOCUMENTS

| | | |
|---|---|---|
| 6,252,290 B1 | 6/2001 | Quek et al. |
| 6,297,554 B1 | 10/2001 | Lin |
| 7,061,111 B2 * | 6/2006 | McTeer ...................... 257/751 |
| 2002/0195715 A1 * | 12/2002 | Cho .......................... 257/774 |

* cited by examiner

USE OF AIN AS COOPER PASSIVATION LAYER AND THERMAL CONDUCTOR

This application is a continuation of application Ser. No. 09/982,953, filed Oct. 22, 2001 now U.S. Pat. No. 7,205,223, which is a divisional of application Ser. No. 09/547,926, filed on Apr. 11, 2000 now U.S. Pat. No. 7,061,111, which are hereby incorporated by reference.

FIELD OF THE INVENTION

The present invention relates to the field of interconnect structures for integrated circuit packages, and in particular, to the use of aluminum nitride (AlN) as a passivation layer for copper interconnect structures for electrically connecting two or more electronic components.

BACKGROUND OF THE INVENTION

The integration of a large number of components on a single IC chip requires complex interconnects. Ideally, the interconnect structures should be fabricated with minimal signal delay and optimal packing density. Because of their increasing importance, the qualities of the interconnect structures drastically affect the reliability and performance of fabricated integrated circuits. Currently, the interconnect structures are increasingly defining the limits in performance and density of modern very-large scale integrated (VLSI) circuits.

Until recently, aluminum and its alloys have been widely used as conductive materials for electrical interconnections because of attractive features such as low electrical resistivity and strong adhesion to silicon dioxide ($SiO_2$), which is typically used as an interlayer dielectric. Unfortunately, however, as VLSI dimensions reach into the deep-submicron regime, aluminum and its alloys become limiting factors in achieving superior performance. For example, with decreasing dimensions, the design rules become restricted by aluminum reliability concerns such as electromigration, which in turn increases the potential for open circuits or voids, stress-induced void formation, hillocks at relatively low temperatures, or humidity-induced corrosion.

For the above reasons, and in an attempt to improve the performance, reliability and density of the interconnects, the microelectronics industry has recently migrated towards alternative metals to aluminum and its alloys. As such, studies have been done on copper and copper oxide, mainly because copper has become a promising interconnect material for the next generation of integrated circuits because of high conductivity, extremely low resistivity and good resistance to electromigration. Unfortunately, copper diffuses rapidly through $SiO_2$ or other interlayer dielectrics, such as polyimides and parylenes. Copper diffusion in the interconnect structure can destroy active devices, such as transistors or capacitors, formed in the IC substrate. In addition, the adhesion of copper to interlayer dielectrics, particularly to $SiO_2$, is generally poor and metal adhesion to the underlying substrate materials must be excellent to form reliable interconnect structures. Further, copper oxidizes easily at low temperatures and has poor adhesion to substrates. Copper has also low reaction temperature with most salicides and requires a high temperature for patterning by reactive ion etching.

In an attempt to overcome these disadvantages posed by copper interconnects, efforts have been made mainly at refining the understanding of the oxidation mechanisms in copper employed in the interconnect structures. For example, W. A. Lanford studied ion implantation as an effective way to passivate copper films. Lanford, W. A. et al., *Low-temperature passivation of copper by doping with Al or Mg*, in THIN SOLID FILMS, 234-41 (1995). By analyzing the growth mechanism for copper, Lanford observed that the oxidation rate could be reduced by adding only a very small concentration of dopant, such as Al or Mg, to the copper.

Similarly, the corrosion resistance of boron (B) implanted copper, particularly its mechanism, has been studied by P. J. Ding et al. in *Investigation of the mechanism responsible for the corrosion resistance of B implanted copper*, B 85 NUCL. INSTRUM. METHODS PHYS. RES., 260-63 (1994). By investigating the oxidation of boron implanted copper and copper oxide ($Cu_2O$), Ding found that the oxidation rate of $Cu_2O$ implanted with boron is as low as that of copper metal (Cu) implanted with boron.

Other methods for overcoming the copper interconnect disadvantages have yet involved scraping the copper layer to remove the copper oxide immediately before the interconnect is formed, or using a barrier layer to passify the copper surfaces. For example, U.S. Pat. No. 4,987,750 describes the use of titanium nitride (TiN), tungsten (W), tungsten nitride (WN), zirconium nitride (ZrN), titanium carbide (TiC), tungsten carbide (WC), tantalum (Ta), tantalum nitride (TaN), or titanium tungsten (TiW) as barrier layers for copper.

Similarly, U.S. Pat. No. 5,447,599 to Li et. al. discloses the use of TiN(O) as a barrier layer material for copper. The copper is initially coated with a layer of titanium and a copper-titanium alloy is formed by heating. Unreacted titanium is then removed and the alloy is transformed to TiN(O) by rapid thermal anneal in ammonia and oxygen.

Many of these materials, however, also form nonconductive oxides, or have poor electrical or thermal conductivity, or a high thermal expansion. Further, many of these barrier layers exhibit instability at temperatures higher than 500° C. Since a silicon substrate is generally subjected to subsequent steps during the IC fabrication, such as annealing or reflow processes which require temperatures higher than 500° C., there is a need for a barrier layer that is stable at the high temperatures required for subsequent substrate processes steps. Also, since copper is increasingly used in the electrical interconnection technology, it is desirable to further improve the processes in which copper oxidation is effectively prevented, while its metallization resistance is kept low even after the substrate has undergone subsequent processing steps.

While copper diffusion and oxidation remain highly significant, high density integration in the microelectronics industry also faces the problem of large amount of heat generated as a result of controlling a large quantity of current. Thus, it is imperative to radiate the large quantity of heat generated to prevent an unacceptable rise in temperature in the semiconductor substrate. For this reason, heat radiation substrates have been used in the semiconductor industry with relative success. Nevertheless, a major drawback of the thermal radiating substrates used in conventional power semiconductor devices is their extremely complicated construction. Recently, aluminum nitride (AlN) has attracted attention, mainly because it has superior dielectric strength (140 to 170 kV/cm) and good thermal conductivity (90 W/m. ° C.), and efforts have been made at trying to join AlN substrate to a copper member, as disclosed, for example, in U.S. Pat. No. 4,611,745 to Nakahashi et. al.

Accordingly, there is a need for an improved copper interconnect structure of an integrated circuit that would not oxidize to form a nonconductive material. A copper interconnect structure with a suppressed oxide growth layer having good electrical conductivity, good thermal conductivity, and low thermal expansion is also needed, as well as a simple process for forming such copper interconnect structure.

SUMMARY OF THE INVENTION

The present invention provides a copper interconnect structure comprising an AlN barrier layer, which provides enhanced thermal conductivity. The present invention also provides for the passivation of copper surfaces by employing an AlN barrier layer on the copper that further enhances the bonding yield by increasing the contact adhesion between the metal layer and the bonding structure.

These and other advantages and features of the invention will be more clearly understood from the following detailed description of the invention which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, electrical and methodology changes may be made and equivalents substituted without departing from the invention. Accordingly, the following detailed description is not to be taken in a limiting sense and the scope of the present invention is defined by the appended claims.

The term "substrate" used in the following description includes any semiconductor-based structure having an exposed silicon surface in which to form the structure of this invention. The term substrate is to be understood as including silicon-on-insulator, doped and undoped silicon, epitaxial layers of silicon supported by a base semiconductor foundation, and other semiconductor structures. Furthermore, when reference is made to a substrate in the following description, previous process steps may have been utilized to form regions or junctions in or over the base semiconductor structure or foundation.

The term "copper" is intended to include not only elemental copper, but copper with other trace metals or in various alloyed combinations with other metals as known in the semiconductor art, as long as such alloy is conductive.

The term "$Al_xN_y$" used in the following description includes not only the ideal AlN compound for which "x" equals "y" equals 50 atomic percentage (or 0.5), but also $Al_xN_y$ for which the "x" and "y" values are different. That is, $Al_xN_y$ includes any other AlN compound for which "x" is smaller than 0.5 and "y" is greater than 0.5, or for which "x" is greater than 0.5 and "y" is smaller than 0.5 (for example, x=0.25 and y=0.75; or x=0.66 and y=0.33). Further, the term $Al_xN_y$ is intended to include not only elemental AlN, but also AlN with other trace metals or trace elements, such as, for example, oxygen or carbon, as long as the properties of AlN remain mainly unaffected.

Figure 1:
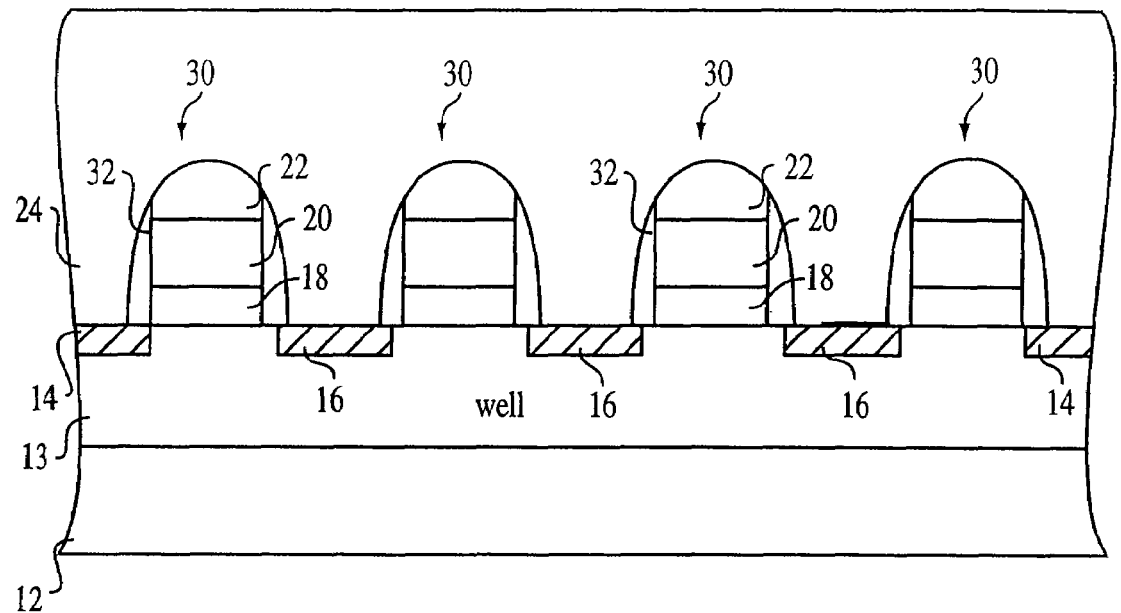
FIG. 1 is a schematic cross-sectional view of a portion of a conventional memory DRAM device illustrating the formation of a copper interconnect structure according to a preferred embodiment and method of the present invention.

Referring now to the drawings, where like elements are designated by like reference numerals, FIGS. 1-10 illustrate one embodiment of an improved copper interconnect structure of the present invention. FIG. 1 depicts a conventional memory cell construction for a DRAM at an intermediate stage of the fabrication, in which a pair of memory cells having respective access transistors are formed on a substrate 12. The FIG. 1 structure includes the substrate 12 having a well 13, which is typically doped to a predetermined conductivity, e.g. p-type or n-type depending on whether NMOS or PMOS transistors will be formed therein. The structure further includes field oxide regions 14, conventional doped active areas 16, and a pair of gate stacks 30, all formed according to well-known semiconductor processing techniques. The gate stacks 30 include an oxide layer 18, a conductive layer 20, such as polysilicon, nitride spacers 32 and a nitride cap 22.

Above the gate oxide region, the polysilicon gates, and the protective nitride regions, a first insulating layer 24 (FIG. 1) is disposed. Insulating layer 24 could be, for example, borophosphosilicate glass (BPSG), borosilicate glass (BSG), or phosphosilicate glass (PSG).

Figure 2:
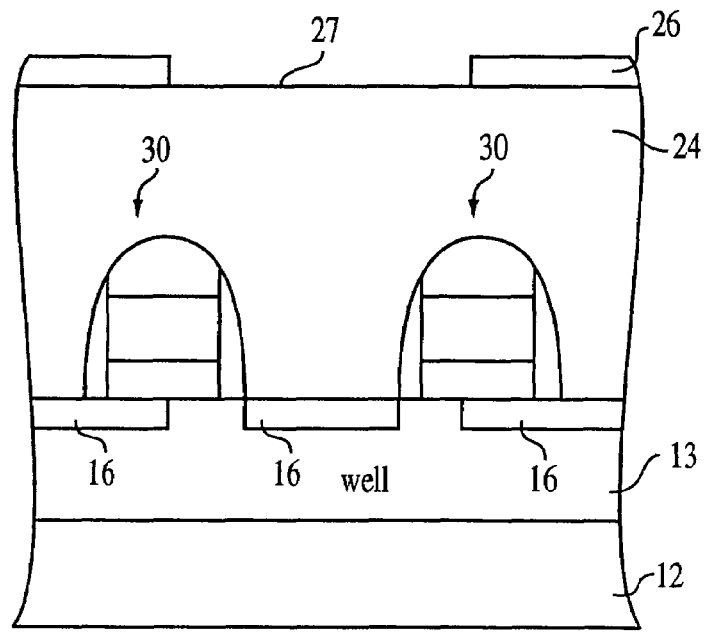
FIG. 2 is a schematic cross sectional view of the copper interconnect structure of FIG. 1 at a stage of processing subsequent to that shown in FIG. 1.
Figure 3:
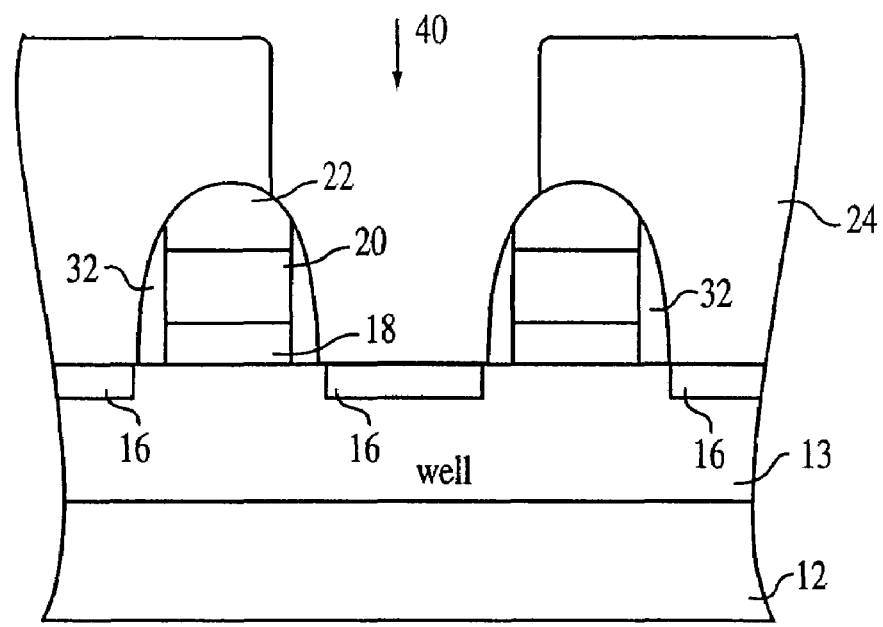
FIG. 3 is a schematic cross sectional view of the copper interconnect structure of FIG. 1 at a stage of processing subsequent to that shown in FIG. 2.

Reference is now made to FIG. 2, which for simplicity illustrates only a middle portion of FIG. 1. To create a contact opening 40 (FIG. 3) into semiconductor substrate 12 through the first insulating layer 24, a photoresist material 26 (FIG. 2) is deposited and patterned using conventional photolithography steps. After patterning, an initial opening 27 (FIG. 2) is present in photoresist layer 26 for subsequent oxide etching. The structure of FIG. 2 is then etched, the photoresist layer 26 removed, and, as shown in FIG. 3, a contact opening 40 is formed through the first insulating layer 24. The contact opening 40 of FIG. 3 is etched so that contact opening 40 contacts a source or drain region 16 of substrate 12.

Figure 4:
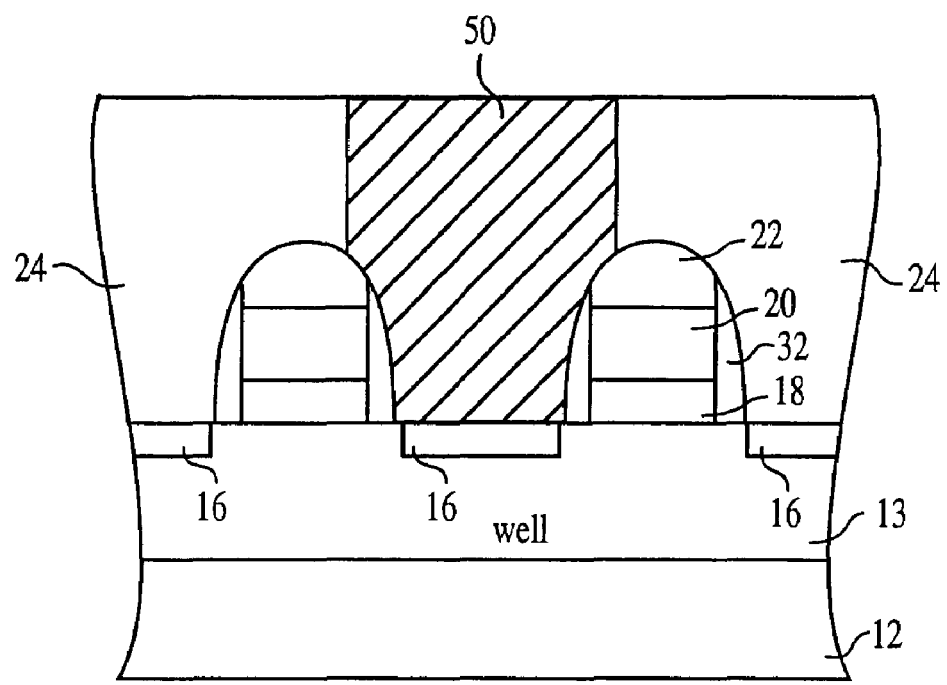
FIG. 4 is a schematic cross sectional view of the copper interconnect structure of FIG. 1 at a stage of processing subsequent to that shown in FIG. 3.
Figure 5:
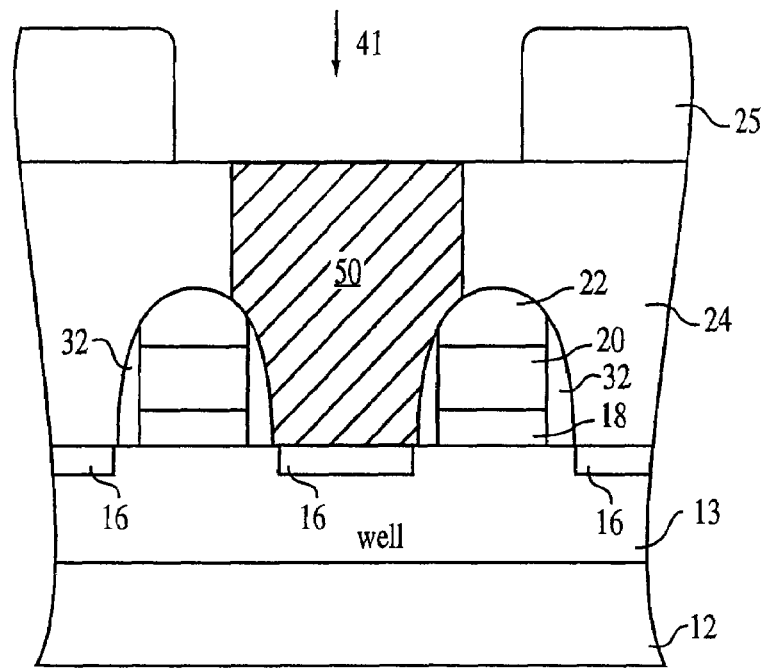
FIG. 5 is a schematic cross sectional view of the copper interconnect structure of FIG. 1 at a stage of processing subsequent to that shown in FIG. 4.
Figure 6:
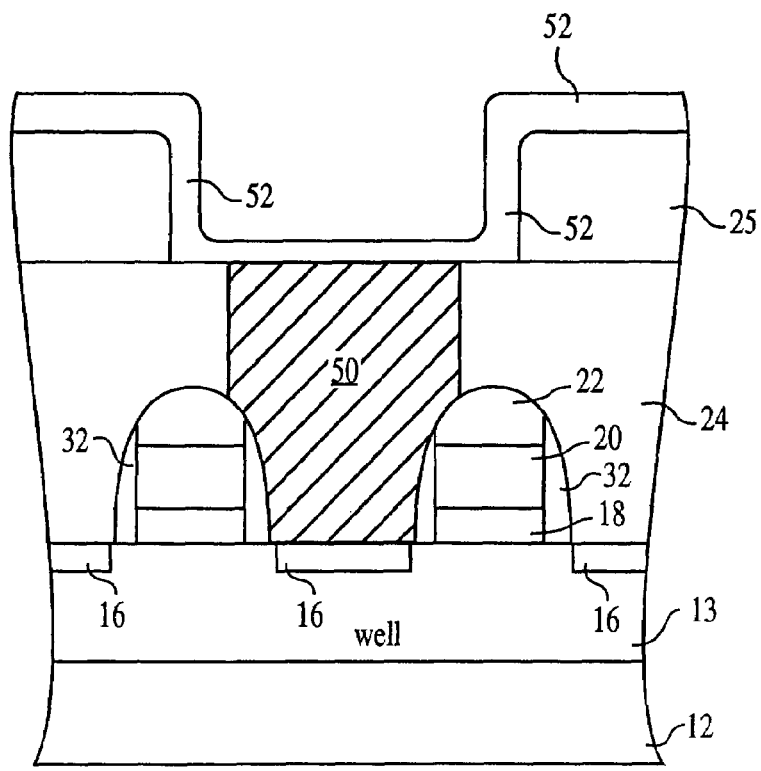
FIG. 6 is a schematic cross sectional view of the copper interconnect structure of FIG. 1 at a stage of processing subsequent to that shown in FIG. 5.

Next, contact opening 40 is filled with a conductive material, such as doped polysilicon, cobalt, titanium nitride (TiN), tungsten (W), tungsten nitride, copper, aluminum, or platinum, which is planarized down to or near the planar surface of the first insulating layer 24, to form a plug or filler 50, as illustrated in FIG. 4. Although any conductive material may be used to fill the plug 50, for simplicity, the plug 50 will be referred to as to a polysilicon plug 50. The polysilicon plug 50 is then anisotropically etched until its top surface is recessed at the same level with the planar surface of the first insulating layer 24.

A second insulating layer 25 (FIG. 5), which could be, for example, a silicon oxide ($SiO_2$), tetraethylortho silicate (TEOS), borophosphosilicate glass (BPSG), borosilicate glass (BSG), phosphosilicate glass (PSG), or a low-dielectric material, such as SILK, FLARE, or Black Diamond, is next deposited over the first insulating layer 24 and the upper surface of the polysilicon plug 50. Again, using the same fabrication technique as that used for the formation of contact opening 40 (FIG. 3) through the first insulating layer 24, a window 41 (FIG. 5) is formed through the second insulating layer 25.

Subsequent to the formation of window 41 (FIG. 5), a thin barrier layer 52 (FIG. 6) is formed over the polysilicon plug 50 and the second insulating layer 25, by CVD, PVD, sputtering or evaporation, to a thickness of about 60 to about 200 Angstroms. Preferred materials for the barrier layer 52 are refractory metal compounds such as refractory metal nitrides (for example TiN or HfN), refractory metal carbides (for example TiC or WC), or refractory metal borides (for example TiB or MoB). It must be noted, however, that while the preferred materials for the barrier layer 52 comprise a wide variety of metal compounds, titanium silicide ($TiSi_2$) is not preferred because the silicon of the titanium silicide reacts with the copper (FIG. 7) subsequently formed on top of the barrier layer 52. Thus, the metal compound of the barrier layer 52 must be resistant to copper diffusion, and, while non-refractory metals may also be used for the barrier layer 52, refractory metals remain the preferred materials. As known in the art, barrier layer 52 must also suppress the diffusion of the silicon or metal atoms of the plug 50, while offering a low resistivity and low contact resistance between the metal of the plug 50 and the barrier layer 52, and between the subsequently deposited copper (FIG. 7) and the barrier layer 52.

Figure 7:
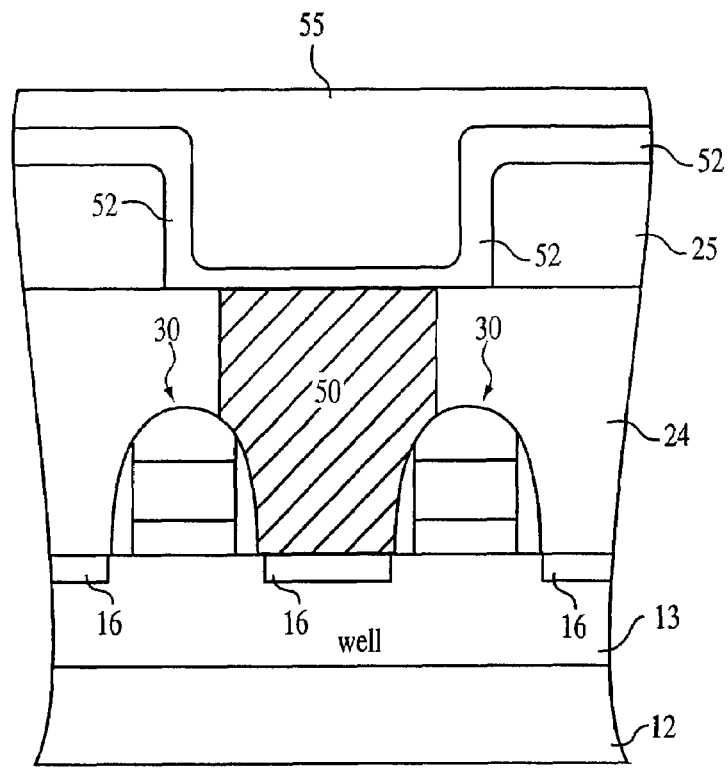
FIG. 7 is a schematic cross sectional view of the copper interconnect structure of FIG. 1 at a stage of processing subsequent to that shown in FIG. 6.
Figure 8:
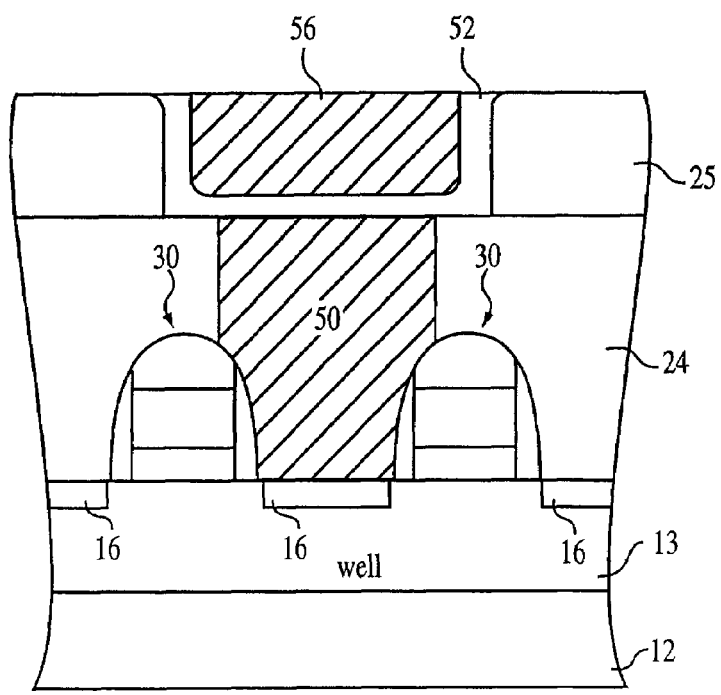
FIG. 8 is a schematic cross sectional view of the copper interconnect structure of FIG. 1 at a stage of processing subsequent to that shown in FIG. 7.

Referring now to FIG. 7, an interconnect copper layer 55 is deposited over the barrier layer 52. Copper layer 55 is used to form metal lines to interconnect various devices formed on substrate 12. Barrier layer 52 prevents the diffusion of copper from copper layer 55 and, as explained above, copper adheres well to barrier layer 52. Adhesion of interconnect copper layer 55 is extremely important for the manufacture of reliable integrated circuits. Next, copper layer 55 is etched back to form a copper plug or conductor 56 (FIG. 8). In the preferred embodiment of the present invention, the metal layer 55 (FIG. 7) is etched back by means of chemical mechanical polishing (CMP) or a well-known RIE dry etching process. In a chemical mechanical polishing, an abrasive polish is used to remove the top surface of copper layer 55 and also the horizontal portions of the barrier layer 52 down to or near the planar surface of the second insulating layer 25. This way, the top surfaces of barrier layer 52 and the copper plug 56 are uniform across the entire surface of the substrate, as illustrated in FIG. 8. Such chemical mechanical polishing process produces an extremely planar surface, which is highly important in the manufacture of high density multilevel integrated circuits.

At the completion of the polishing process, an $Al_xN_y$ passivation layer 60 (FIG. 9) (where x and y may be the same or different) is formed over the copper plug 56 and the upper surface of the second insulating layer 25, so that the formation of a copper interconnect structure 100 (FIG. 9) can be completed. For simplicity, reference to the $Al_xN_y$ passivation layer 60 will be made in this application as to AlN passivation layer 60. The copper interconnect structure 100 comprises, therefore, the polysilicon (or other conductor) plug 50, the barrier layer 52, the copper plug 56 and the AlN passivation layer 60.

The AlN passivation layer 60 (FIG. 9) could be deposited, for example, by using plasma, reactive sputtering, or a conventional chemical vapor deposition, to form a continuous and smooth AlN layer across the substrate 12, including the copper plug 56 and the upper surface of the second insulating layer 25. The AlN passivation layer 60 has a thickness in the range of about 100 Angstroms to about 1,000 Angstroms, preferably of about 300 Angstroms. AlN also has a good thermal expansion coefficient (2.6×10e(−6)), a high melting point (2400° C.), and a very high thermal conductivity (1.5 W/cmK). The AlN passivation layer 60 has the additional advantage of radiating large quantities of heat to prevent the raise in temperature in the semiconductor substrate and the copper interconnect structure 100. Thus, while passifying the copper, the AlN layer may be also used as a thermally conductive dielectric barrier layer for the copper interconnect structure 100.

Furthermore, although the AlN passivation layer has been described as a passifying and thermally conductive layer with respect to copper, AMN may also constitute a heat dissipating path used with other metallurgy and the present invention is not limited to the use of AlN layer as a thermal conductor for copper. Thus, the AlN layer may be used also as a heat dissipating path for other metals and their corresponding alloys which are in contact therewith, such as aluminum, gold, silver, tungsten, or gallium arsenide, to name just a few, that are used as electrical conductors in various metallization schemes.

To facilitate the formation of the AlN passivation layer and the subsequent passivation of the copper, the surface of the copper plug 56 may be cleaned and/or pretreated before the formation of the AlN passivation layer. Thus, if an in-situ cleaning technique is used, a noble gas such as argon or neon may be used to clean off any copper oxide or any other residual particles, such as aluminum oxide or dry slurries, formed on the copper surface of the copper plug prior to the formation of the AlN passivation layer. Alternatively, an ex-situ technique, such as a wet chemical etch, may be used for the pretreatment of the copper surface prior to the formation of the AlN layer.

Figure 9:
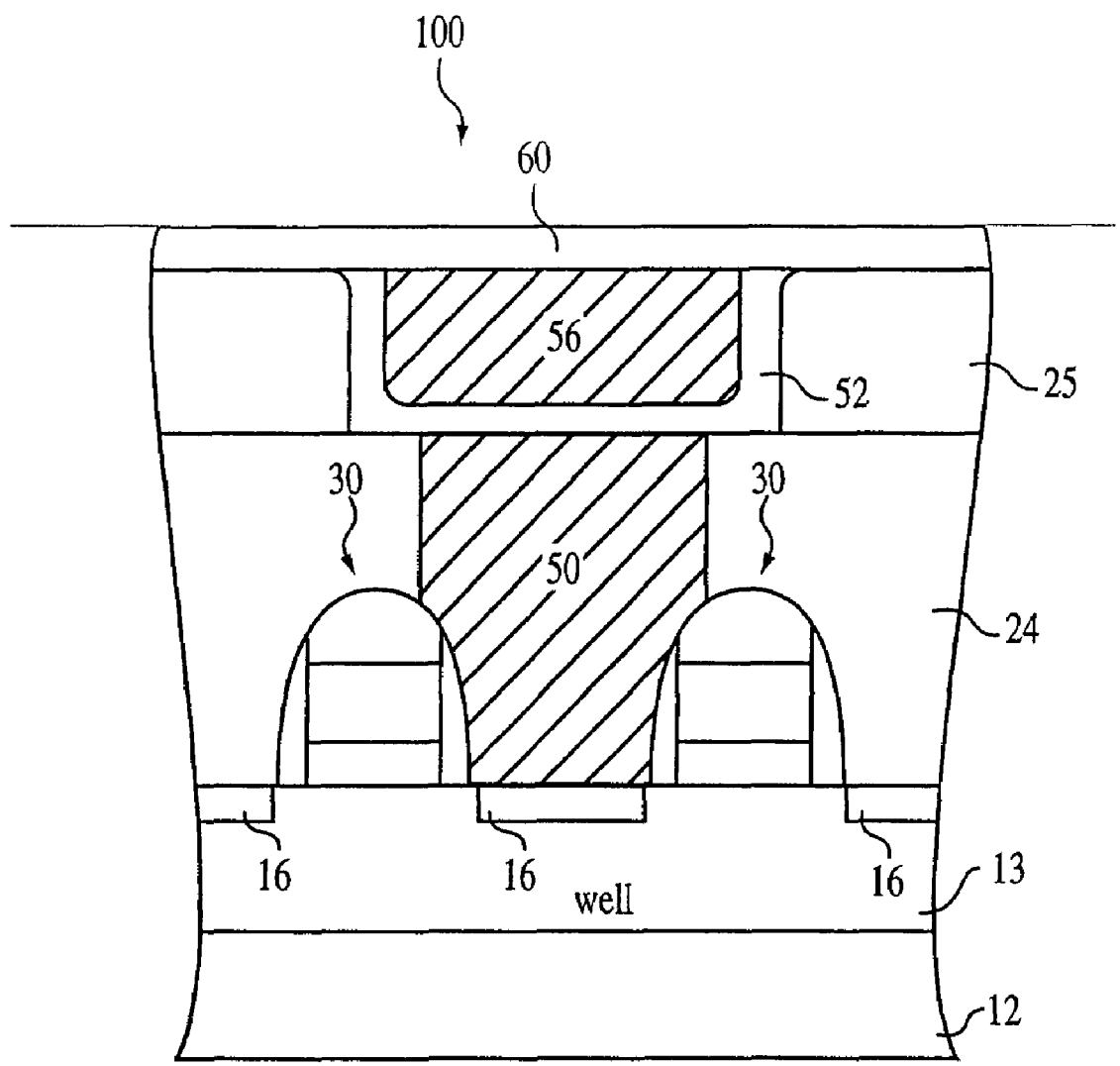
FIG. 9 is a schematic cross sectional view of the copper interconnect structure of FIG. 1 at a stage of processing subsequent to that shown in FIG. 8.

Although only one copper interconnect structure 100 is shown in FIG. 9, it will be readily apparent to those skilled in the art that in fact any number of such copper interconnect structures are formed on the substrate 12.

Figure 10:
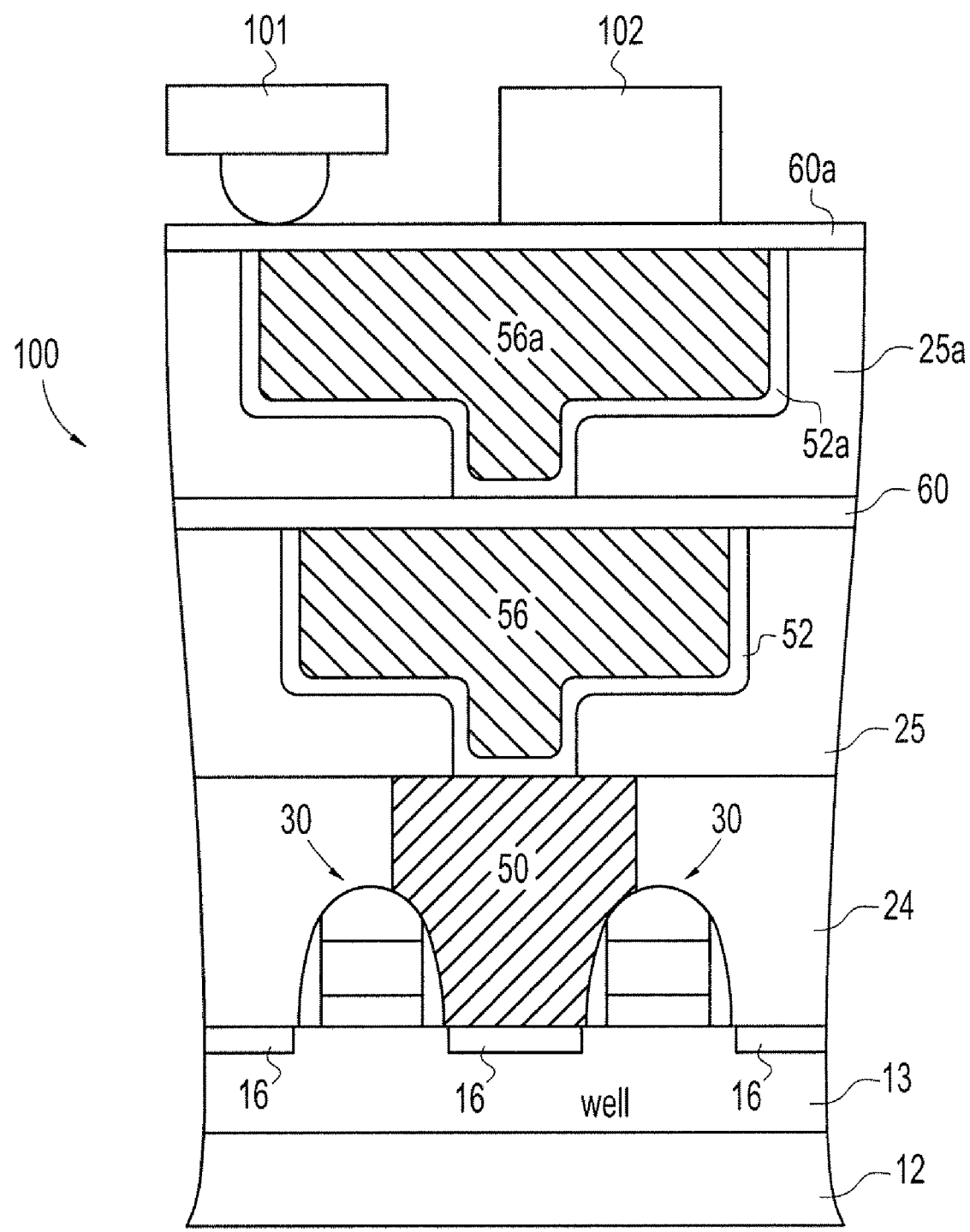
FIG. 10 is a schematic cross sectional view of the copper interconnect structure of FIG. 1 at a stage of processing subsequent to that shown in FIG. 9.

Also, although FIG. 9 illustrates a copper interconnect structure with only one copper plug passivated by an AlN layer, it must be understood that any number of such copper plugs with their corresponding AlN layers may be formed according to the specific requirements of the device. For example, as illustrated in FIG. 10, two copper plugs 56, 56a may be formed on the polysilicon (or other conductor) 50, with the copper plug 56a being adjacent to, and on top of, the copper plug 56. Same processing steps for the fabrication of the copper plug 56, which were described above with reference to FIGS. 5-9, are employed for the fabrication of the copper plug 56a. As such, the copper plug 56a is first formed through a second insulating layer 25a (FIG. 10), which in turn is formed on top of the AlN passivation layer 60 (FIG. 9). Next, an $Al_xN_y$ passivation layer 60a (FIG. 10) (where x and y may be the same or different) is formed over the copper plug 56a and the upper surface of the second insulating layer 25a, so that the formation of the copper interconnect structure 100 (FIG. 10), which now contains two copper plugs passivated by two AlN layers, can be completed. Additional steps may be employed to provide electrical contact between the copper interconnect structure 100 and the source or drain region 16 of the substrate 12. It must be noted that, although FIG. 10 illustrates two copper plugs 56, 56a being adjacent to each other, the plurality of copper plugs passivated by their corresponding AlN layers need not be adjacent, as long as an operative electrical path could be achieved for a multilevel interconnect system.

Additional interconnect layers and associated dielectric layers could be formed to produce an operative electrical path from the copper plug 56a and the barrier layer 52a, to the copper plug 56, the barrier layer 52 and the polysilicon plug 50, and down to the source or drain region 16 of the substrate 12. It must be noted that, although aluminum nitride is a thermal conductor, it is also a dielectric material. Therefore, to produce an operative electrical path for multilevel interconnections, persons of ordinary skills in the art will realize that small contact openings must be created in the AlN layer to permit further electrical connection between the copper plugs 56, 56a and higher level of metallization paths.

Further, the invention is not limited to a particular form of interconnect structure, but may be used with any copper interconnect structure such as conductive wires, TAB, C4 or bumps, conductive adhesives, or the like. Thus, while the present invention has been described with reference to the AlN layer 60 (FIGS. 9-10) connected to a copper conductor, the AlN layer 60 may be further connected to a bond pad 101 (FIG. 10) and/or an external heat path, for example, an external heat sink 102 (FIG. 10).

Also, although the invention has been described as a copper plug connected to the active area of a memory cell through a conductive plug, it is to be understood that the invention is not limited to copper plugs, but can also be used with copper layer metallization for multilevel interconnect systems, as well as with other conductive plugs and metallization layers. The AlN layer, acting as a thermal conductor and a passivation layer for the copper traces of the multilevel interconnect, could be deposited in a manner similar to that employed for the deposition of the AlN layers 60, 60a and explained with reference to the formation of the copper interconnect structure 100 (FIGS. 1-10).

Figure 11:
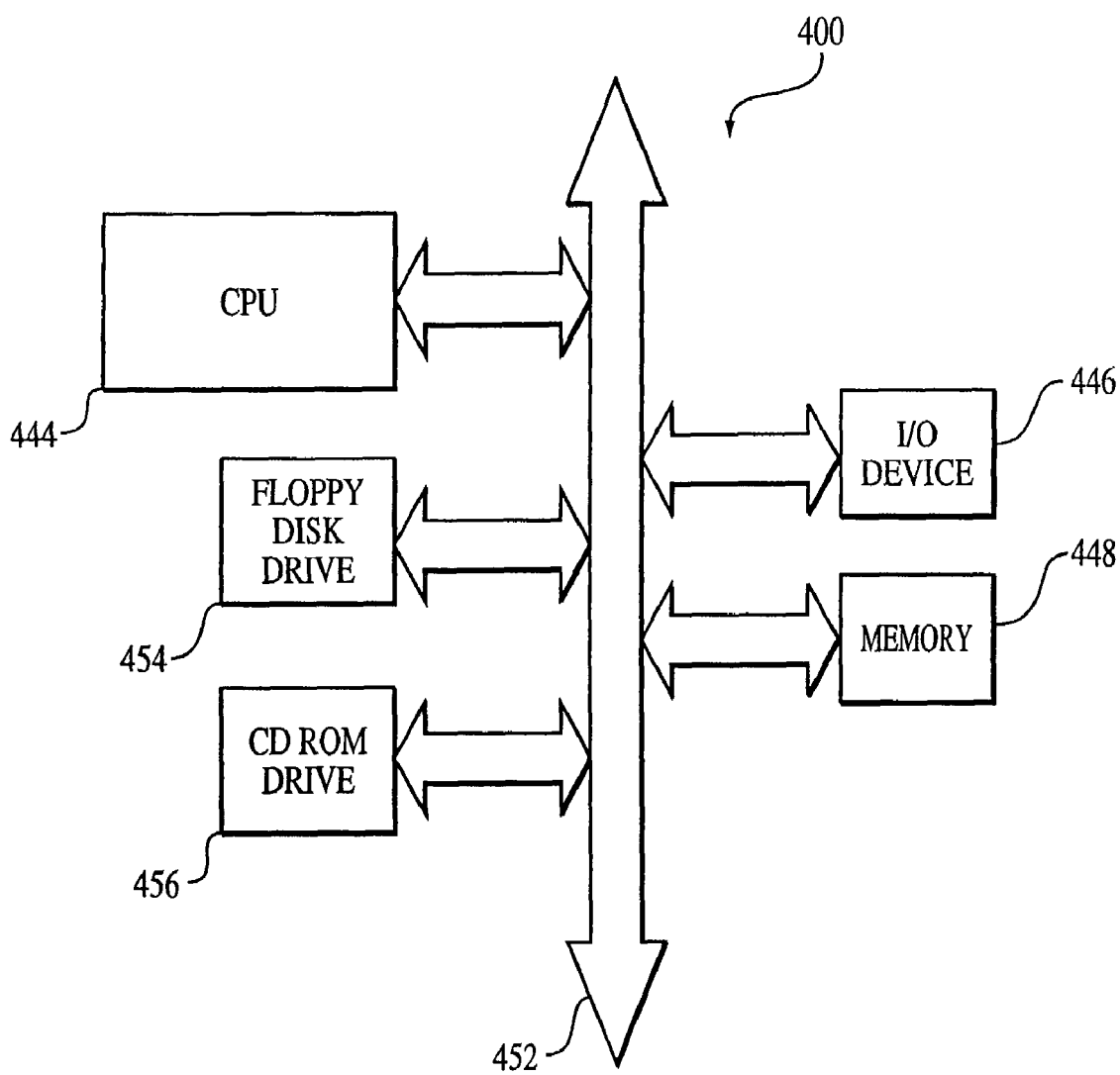
FIG. 11 is an illustration of a computer system having a memory cell with a copper interconnect structure according to the present invention.

A typical processor based system 400 which includes a memory circuit 448, e.g. a DRAM, containing copper interconnects structures according to the present invention is illustrated in FIG. 11. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes copper interconnect structures formed as previously described with respect to FIGS. 1-10. The memory 448 may be combined with the processor, e.g. CPU 444, in a single integrated circuit.

Although the exemplary embodiments described above refer to one copper interconnect structure, it is to be understood that the present invention contemplates the use of a plurality of copper interconnect structures, and it is not limited by the illustrated embodiments. Accordingly, the above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An interconnect structure providing electrical connection in a semiconductor device, the interconnect structure comprising:
    a first conductive plug;
    a plurality of second conductor plugs stacked over the first conductor plug, the first conductive plug being electrically coupled to a first of the second conductor plugs;
    a plurality of passivation material regions comprising aluminum nitride, each one of the passivation material regions being in contact with a top surface of one of the second conductor plugs; and
    a plurality of barrier material regions, each one of the barrier material regions formed on a bottom surface of one of the second conductor plugs.

2. The interconnect structure of claim 1, further comprising a bond pad, the bond pad being connected to a last of the passivation material regions.

3. The interconnect structure of claim 1, further comprising an external heat dissipating path, the external heat dissipating path being connected to a last of the passivation material regions.

4. The interconnect structure of claim 1, wherein the first conductive plug is electrically connected to an active area of a substrate.

5. The interconnect structure of claim 1, wherein the first conductive plug is formed of a material selected from the group consisting of polysilicon, cobalt, titanium nitride, tungsten, tungsten nitride, copper, aluminum, and platinum.

6. The interconnect structure of claim 1, wherein the second conductor plugs are copper conductor plugs formed of elemental copper.

7. The interconnect structure of claim 1, wherein the passivation material regions are from about 100 Å to 1,000 Å thick.

8. The interconnect structure of claim 1, wherein the passivation material regions are approximately 300 Å thick.

9. The interconnect structure of claim 1, wherein the barrier material regions comprise a refractory metal compound selected from the group consisting of refractory metal nitrides, refractory metal carbides, and refractory metal borides.

10. An integrated circuit containing a copper interconnect structure, the copper interconnect structure comprising:
    a conductive plug;
    a plurality of copper material regions stacked over the first conductor plug, the conductive plug being electrically coupled to a first of the copper material regions;
    a plurality of heat-radiating passivation material regions, each one of the passivation material regions being in contact with a top surface of one of the copper material regions; and
    a plurality of barrier material regions, each one of the barrier material regions being formed between one of the copper material regions and one of the passivation material regions or the conductive plug, the passivation material regions comprising a substantially continuous region of aluminum nitride and being approximately 100 Å to approximately 1000 Å thick.

11. The integrated circuit of claim 10, wherein the passivation material regions have contact openings to provide further electrical connection between the copper layers.

* * * * *

UNITED STATES PATENT AND TRADEMARK OFFICE
CERTIFICATE OF CORRECTION

PATENT NO. : 7,679,193 B2 Page 1 of 1
APPLICATION NO. : 11/710924
DATED : March 16, 2010
INVENTOR(S) : Allen McTeer et al.

It is certified that error appears in the above-identified patent and that said Letters Patent is hereby corrected as shown below:

On face page, in field 54, in column 1, Title, line 1, delete "COOPER" and insert -- COPPER --, therefor.

In column 1, Title, line 1, delete "COOPER" and insert -- COPPER --, therefor.

Signed and Sealed this

Twenty-fifth Day of May, 2010

David J. Kappos
*Director of the United States Patent and Trademark Office*